(12) United States Patent
Cai et al.

(10) Patent No.: US 9,473,138 B2
(45) Date of Patent: Oct. 18, 2016

(54) CROSSTALK COMPENSATION CIRCUIT

(71) Applicant: Intel Corporation, Santa Clara, CA (US)

(72) Inventors: Fengxiang Cai, Northborough, MA (US); Zibing Yang, Lexington, MA (US); Harry Muljono, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/581,947

(22) Filed: Dec. 23, 2014

(65) Prior Publication Data

US 2016/0182046 A1 Jun. 23, 2016

(51) Int. Cl.
*H03K 5/12* (2006.01)
*H03K 19/003* (2006.01)
*H03K 5/1534* (2006.01)

(52) U.S. Cl.
CPC .......... *H03K 19/00346* (2013.01); *H03K 5/12* (2013.01); *H03K 5/1534* (2013.01)

(58) Field of Classification Search
None
See application file for complete search history.

(56) References Cited

U.S. PATENT DOCUMENTS 7,492,850 B2 * 2/2009 Menolfi ................ H03D 3/006
327/141
2008/0204093 A1 * 8/2008 Lin ........................... G06F 1/10
327/158
2012/0306551 A1 * 12/2012 Moon ................... H03L 7/0814
327/149

OTHER PUBLICATIONS

J.F. Buckwalter, et al., "Cancellation of cross-talked induced jitter," IEEE JSSC, Mar. 2006, pp. 621-631.
K-J Sham, et al., "FEXT crosstalk cancellation for high-speed serial link design," IEEE CICC, Sep. 2006, pp. 405-408.
C. Pelard, et al., "Realization of multigigabit channel euqalization and crosstalk cancellation integrated circuits," IEEE JSCC, Oct. 2004, pp. 1659-1669.
Y. Hur et al., Equalization and near-end crosstalk (NEXT) noise cancellation for 20-Gb/s 4-PAM backplane serial I/O interconnections, IEEE JSSC, Jan. 2005, pp. 246-255.
J. Zerbe, et al., "A 2Gb/s/pin 4-PAM Parallel Bus Interface with Transmit Crosstalk Cancellation, Equalization, and Integrating Receivers," ISSCC 2001 / Session 4 / High-Speed Digital Interfaces, pp.
T. Oh et al., "A 12 Gb/s multi-channel I/O using MIMO crosstalk cancellation and signal reutilization in 65 nm CMOS," IEEE JSSC 48(6) 2013, pp. 1383-1397.

* cited by examiner

*Primary Examiner* — Cassandra Cox
(74) *Attorney, Agent, or Firm* — Schwabe, Williamson & Wyatt, P.C.

(57) ABSTRACT

Embodiments include apparatuses, methods, and systems for crosstalk compensation. In embodiments, a transmitter may include a crosstalk compensation circuit that may receive a victim data signal and one or more attacker data signals. The crosstalk compensation circuit may adjust the timing of transitions in the victim data signal based on detected transitions in the one or more attacker data signals. Other embodiments may be described and claimed.

18 Claims, 4 Drawing Sheets

CROSSTALK COMPENSATION CIRCUIT

FIELD

Embodiments of the present invention relate generally to the technical field of electronic circuits, and more particularly to crosstalk compensation in electronic circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

In very large scale integration (VLSI) circuits, there are often many channels that route data signals between circuits on a printed circuit board (PCB) or integrated circuit (IC) package. Crosstalk can occur between the data signals. The crosstalk can reduce eye height and contaminate eye width, causing edge/phase variation in the data signals.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B) For the purposes of the present disclosure, the phrase "A, B, and/or C" means (A), (B), ((C) (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
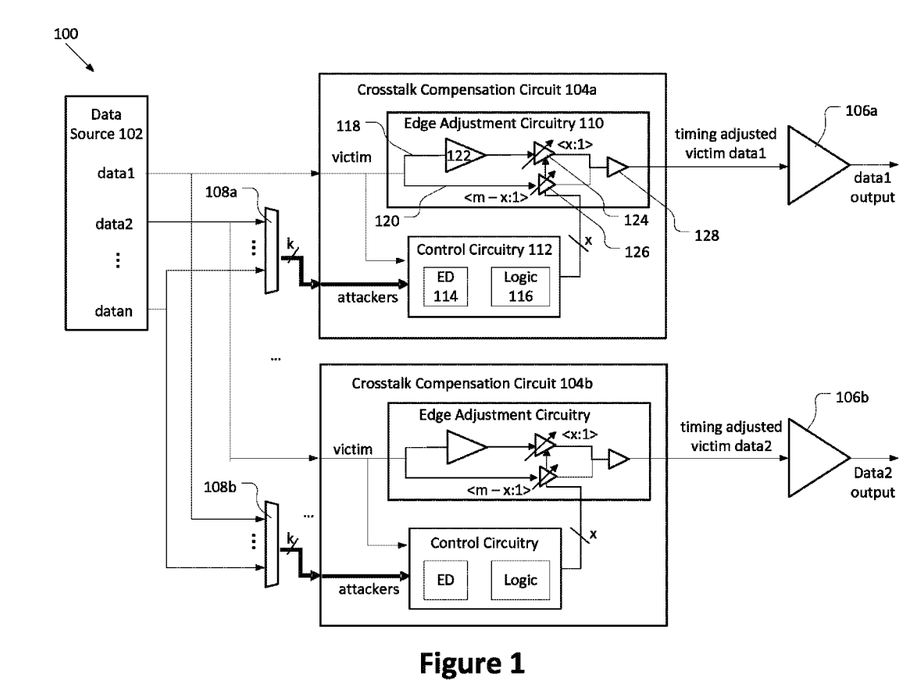
FIG. 1 illustrates a circuit that includes a crosstalk compensation circuit, in accordance with various embodiments.

FIG. 1 illustrates a circuit 100 in accordance with various embodiments, Circuit 100 may be included in a transmitter of an integrated circuit to transmit a plurality of data signals (e.g. to another portion of the integrated circuit or to another integrated circuit). The circuit 100 may include a data source 102 to provide the plurality of data signals (e.g., data1, data2, . . . datan). The data signals may include any suitable type of signal that transitions between a relatively low value (e.g., voltage) and a relatively high value, such as a signal that encodes data or a clock signal. In various embodiments, the circuit 100 may further include one or more crosstalk compensation circuits 104a-b. The individual crosstalk compensation circuits 104a-b may adjust the timing of transitions (e.g., edges) of a respective data signal (referred to as a "victim data signal") to compensate for crosstalk caused by one or more other data signals (referred to as "attacker data signals").

In various embodiments, the crosstalk compensation circuits 104a-b may output timing adjusted victim data signals, and may pass the timing adjusted victim data signals to respective output drivers 106a-b. The output drivers 106a-b may transmit the respective timing adjusted victim data signals to one or more receiver circuits (not shown), e.g., via respective channels. The channels may be, for example, on an integrated circuit package that includes the circuit 100 and/or on a printed circuit board (PCB) on which the circuit 100 is disposed (e.g., to transmit the data signals to another integrated circuit on the PCB). As the victim data signals are transmitted on respective channels, transitions in the attacker data signals transmitted on the other channels may cause transitions in the victim data signals to be shifted in time (e.g., due to crosstalk).

In various embodiments, the crosstalk compensation circuits 104a-b may pre-emptively adjust the timing of the transitions in the victim data signals, based on detected transitions in the respective victim data signal and/or attacker data signals, prior to the victim data signals being transmitted via the channels (e.g., by output drivers 106a-b). Accordingly, the crosstalk exhibited on the timing adjusted victim data signals may shift the transitions in the timing adjusted victim data signals so that the victim data signals are received by the receiver circuit with the desired timing of the transitions (e.g., with an eye center of the victim data signal aligned with transitions in an associated clock signal).

In some embodiments, the crosstalk compensation circuits 104a-b may be coupled in the data path of the transmitter after the last flop of the transmitter. The crosstalk compensation circuits 104a-b may pass the timing adjusted victim data signals directly to the respective output drivers 106a-b.

In various embodiments, the crosstalk compensation circuits 104a-b may receive a victim data signal and one or more attacker data signals. For example, the crosstalk compensation circuit 104a may receive the data signal data1 as the victim data signal, and the crosstalk compensation circuit 104b may receive the data signal data2 as the victim data signal.

In some embodiments, the crosstalk compensation circuits 104a-b may receive the one or more attacker data signals via a respective multiplexer 108a-b. The multiplexer 108a-b may receive a plurality of data signals from the data source 102. For example, the multiplexer 108a-b may receive all of the data signals associated with a block of data (e.g., a byte of data) apart from the victim data signal. The multiplexer 108a-b may pass one of more of the received data signals (e.g., a selected subset of the received data signals) to the crosstalk compensation circuit 104a-b as the one or more attacker data signals. The attacker data signals may be selected, for example, based on a proximity of a channel that carries the attacker data signal and a channel that carries the victim data signal, A channel with a closer proximity to the channel on which the victim data signal is transmitted may have a larger crosstalk effect than a channel that is further away. In some embodiments, the circuit 100 may dynamically select the attacker data signals (e.g., using a select signal) based on one or more operating conditions of the circuit 100.

In some embodiments, the circuit 100 may additionally or alternatively be able to selectively bypass the crosstalk compensation circuits 104a-b in the data path (e.g., to reduce power consumption and/or reduce latency). For example, the circuit 100 may disable the crosstalk compensation and instead pass the data signals from the data source 102 to the output drivers 106a-b without being processed by the crosstalk compensation circuits 104a-b.

In some embodiments, the circuit 100 may include a crosstalk compensation circuit 104a-b for each of the data signals provided by data source 102 (e.g., to process the respective data signal as the victim data signal). The components and operation of the crosstalk compensation circuit 104a will be described in further detail below. However, it will be apparent that the other crosstalk compensation circuits e.g. crosstalk compensation circuit 104b) may include similar components and/or functionality.

In various embodiments, the crosstalk compensation circuit 104a may include edge adjustment circuitry 110 and control circuitry 112. The control circuitry 112 may include an edge detector 114 and logic 116. In various embodiments, the edge detector 114 may detect transitions in the victim data signal and the one or more attacker data signals, and may pass transition information associated with the transitions to the logic 116. For example, the transition information may include information that indicates whether a transition occurred in the signal over a given time period (e.g., 1 unit interval (UI)), and the direction (e.g., rising edge or falling edge) of the transition. The logic 116 may receive the transition information and may control the edge adjustment circuitry 110 to adjust a timing of the transition in the data signal based on the transmission information (e.g., based on detected transitions in the one or more attacker data signals and the victim data signal).

For example, the logic 116 may generate a control code having a value, x, that is based on the transmission information. The edge adjustment circuitry 110 may adjust a timing of the transition in the victim data signal, based on the value of the control code, to generate the timing adjusted victim data signal. For example, the edge adjustment circuitry 110 may delay the victim data signal by an amount that is based on the value of the control code.

In some embodiments, the edge adjustment circuitry 110 may include a first path 118 and a second path 120 that both receive the victim data signal. The first path 118 may include a delay cell 122 that delays the victim data signal by a pre-defined amount. The first path 118 may further include a drive strength adjustable buffer 124 that receives the delayed victim data signal from the delay cell 122. The drive strength adjustable buffer 124 may further receive the control code from the control circuitry 112, and may apply a drive strength (e.g., amplification) to the delayed victim data signal on the first path 118 that is based on the control code. For example, the drive strength adjustable buffer 124 may increase the drive strength of the delayed victim data signal on the first path 118 as the value of the control code increases. For example, the control code may have a maximum value of m, and the drive strength adjustable buffer 124 may include a plurality of buffers (e.g., m buffers) coupled in parallel. The drive strength adjustable buffer 124 may activate a number of the buffers according to the value, x, of the control code (e.g., 0 buffers for x=0, 1 buffer for x=1, . . . m buffers for x=m).

In various embodiments, the second path 120 may include a drive strength adjustable buffer 126 that receives a non-delayed version of the victim data signal (e.g., the second path 120 may not include a delay cell). The drive strength adjustable buffer 126 may further receive the control code from the control circuitry 112, and may apply a drive strength (e.g., amplification) to the victim data signal on the second path 120 that is based on the control code. The drive strength adjustable buffer 126 may have an inverse relationship of the applied drive strength relative to the value of the control code. That is, the drive strength adjustable buffer 126 may decrease the drive strength of the delayed victim data signal on the second path 120 as the value of the control code increases. For example, the drive strength adjustable buffer 126 may include a plurality of buffers (e.g., m buffers) coupled in parallel. The drive strength adjustable buffer 126 may activate a number of the buffers equal to m−x (e.g., m buffers for x=0, m−1 buffers for x=1, . . . 0 buffers for x=m).

In various embodiments, the edge adjustment circuitry 110 may combine the outputs of the first path 118 and the second path 120 to generate the timing adjusted victim data signal (e.g., via an amplifier 128). In embodiments, the timing adjusted victim data signal may be a weighted average of the output signals from the first path 118 and the second path 120, that is weighted according to the relative drive strengths of the drive strength adjustable buffers 124 and 126. The timing adjusted victim data signal may have a transition that is timed according to a weighted average of the output signals. Accordingly, the edge adjustment circuitry 110 may be able to provide a range of timing delays for the transition that range from 0 delay to the delay of the delay cell 122. A step size of the range of timing delays provided by the edge adjustment circuitry 110 may be dictated by the size (e.g., number of possible values) of the control code and/or the number of buffers included in the drive strength adjustable buffers 124 and 126.

Accordingly, the achievable delay of the edge adjustment circuitry 110 may be defined by the delay of the delay cell 122, and may be independent of process, voltage, and temperature (PVT) variation. In some embodiments, the edge adjustment circuit 110 may include a plurality of delay cells 122 coupled in series on the first path 118 to provide a wider range of achievable delays.

In various embodiments, the crosstalk compensation circuit 104a may perform a training process to determine the values of the control code that are to be used during normal operation of the crosstalk compensation circuit 104a. For example, the control code with the value of 0 may be set to correspond to an early setting attic edge adjustment circuitry 110 (e.g., a lowest amount of delay of the victim data signal that is needed). The crosstalk compensation circuit 104a may then sweep through values of the control code to find a high value that corresponds to a late setting of the edge adjustment circuitry. The high value may be identified, for example, as the value of the control code for which the transitions received by the receiver circuit have the largest eye opening. The crosstalk compensation circuit 104a may set the value of the control code that is midway between the early setting and the late setting to be the center setting.

In various embodiments, the crosstalk compensation circuit 104a (e.g., the logic 116 of control circuitry 112) may apply a pre-determined amount of timing adjustment (e.g., delay) to the victim data signal based on the occurrence and direction of a transition in a given attacker data signal. The magnitude of the timing adjustment may be different for different attacker data signals. For example, the crosstalk compensation circuit 104a may apply a timing adjustment to the victim data signal according to the following equation:

$$TV_0' = TV_0 + w1*ATK_1 + w2*ATK_2 \ldots + wn*ATK_n$$

where $TV_0'$ is the adjusted timing of the transition of the victim data signal, $TV_0$ is the original timing of the transition of the victim data signal, $ATK_1$, $ATK_2$, ... $ATK_n$ is the amount (magnitude) of timing adjustment for the occurrence of a transition in the given attacker data signal, and w1, w2, ... wn is the polarity bit (e.g., +1 or −1) for the timing adjustment corresponding to the given attacker data signal.

In various embodiments, if a given attacker data signal does not have a transition in the time period (e.g., UI), then the timing attic victim data signal may not be adjusted for that attacker data signal (e.g., ATK=0). For example, if none of the attacker data signals have a transition in the time period, then the value, x, of the control code may be set to the center setting. Additionally, if the victim data signal does not have a transition in the time period, then the timing of the victim data signal may not be adjusted, even if one or more attacker data signals have transitions. In this case, the value, x, of the control code may be set to the center setting.

In various embodiments, the magnitude of the timing adjustment (e.g., $ATK_1$, $ATK_2$, ... $ATK_n$) for each attacker data signal may be pre-determined. For example, the magnitude of the timing adjustment for a given attacker data signal may be determined based on the routing of the channels that carry the victim data signal and the attacker data signals (e.g., based on expected time-shifting effect of crosstalk on the victim data signal due to transitions in the attacker data signal).

In various embodiments, the polarity of the timing adjustment may be based on the direction of the transition (e.g., rising edge or falling edge) in the attacker data signal and/or the victim data signal. For example, in some embodiments (e.g., when the interference between channels is primarily caused by inductive coupling), the polarity bit w may be negative (to move the transition in the victim data signal earlier) if the attacker data signal and the victim data signal have a same transition direction (e.g., both have a rising edge (e.g., 01) or both have a falling edge (e.g., 10)). The polarity bit w may be positive (to move the transition in the victim data signal later) if the attacker data signal and the victim data signal have a different transition direction (e.g., one has a rising edge and one has a falling edge).

In other embodiments, (e.g., when the interference between channels is primarily caused by capacitive coupling), the polarity bit w may be positive (to move the transition in the victim data signal later) if the attacker data signal and the victim data signal have a same transition direction (e.g., both have a rising edge (e.g., 01) or both have a falling edge (e.g., 10)). The polarity bit w may be negative (to move the transition in the victim data signal earlier) if the attacker data signal and the victim data signal have a different transition direction (e.g., one has a rising edge and one has a falling edge).

Figure 2:
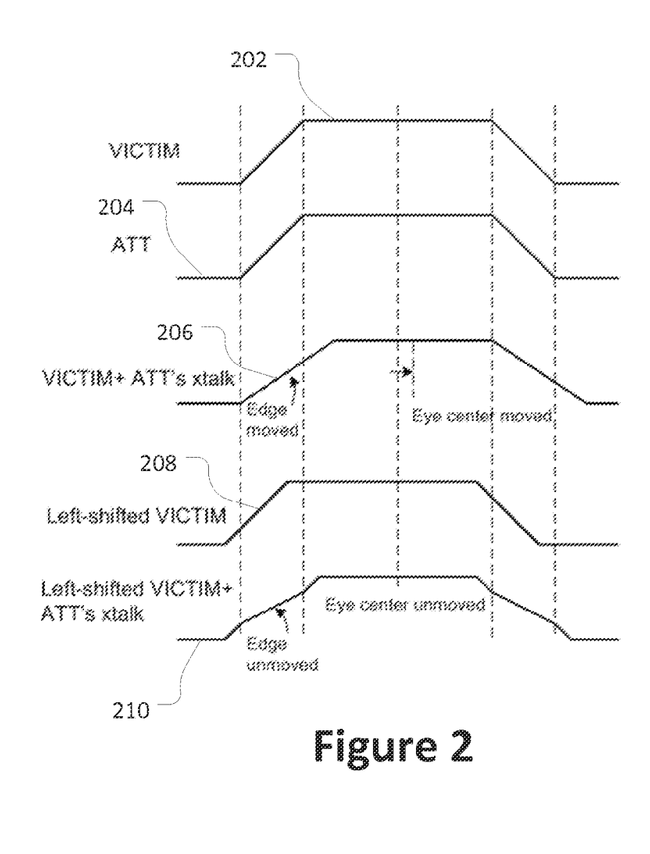
FIG. 2 illustrates a set of waveforms of example data signals, in accordance with various embodiments.

To illustrate, FIG. 2 shows a plurality of example waveforms in accordance with various embodiments. Waveform 202 corresponds to a victim data signal and waveform 204 corresponds to an attacker data signal at the transmitter (e.g., circuit 100) before any timing adjustment. The waveform 202 and waveform 204 are shown undergoing a 010 data pattern, with a rising edge followed by a falling edge. Waveform 206 shows the victim data signal that would be received at the receiver without edge timing adjustment, with the effect of crosstalk from the attacker data signal. As shown, the rising edge of the attacker data signal pushes the rising edge of the victim data signal later, thereby also moving the eye center of the victim data signal later in time.

The waveform 208 shows the timing adjusted victim data signal that is generated by the crosstalk compensation circuitry (e.g., crosstalk compensation circuitry 104a) discussed herein. The rising edge of the timing adjusted victim data signal is shifted earlier in time compared with the waveform 202. Waveform 210 shows the timing adjusted victim data signal that is received at the receiver, with the effect of crosstalk from the attacker data signal. The rising edge of the waveform 210 is centered in the same timing location as the waveform 202, and the eye center of the waveform 210 has the same timing as the eye center of the waveform 202. Accordingly, the timing adjusted victim data signal pre-emptively adjusts the timing of the transition so that the timing adjusted victim data signal arrives at the receiver with proper alignment relative to the clock signal.

Figure 3:
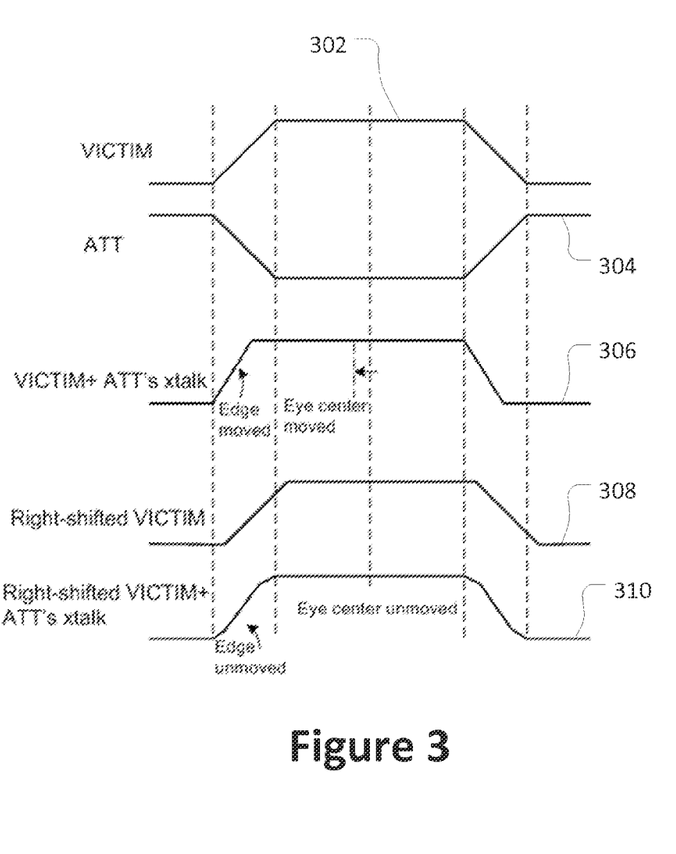
FIG. 3 illustrates another set of waveforms of example data signals, in accordance with various embodiments.

FIG. 3 shows another set of a plurality of example waveforms in accordance with various embodiments. Waveform 302 corresponds to a victim data signal and waveform. 304 corresponds to an attacker data signal at the transmitter (e.g., circuit 100) before any timing adjustment. The waveform 302 is shown undergoing a 010 data pattern, with a rising edge followed by a falling edge. In contrast, the waveform 304 is shown undergoing a 101 data pattern, with a falling edge followed by a rising edge. Waveform 306 shows the victim data signal that would be received at the receiver without edge timing adjustment, with the effect of crosstalk from the attacker data signal. As shown, the rising edge of the attacker data signal pushes the rising edge of the victim data signal earlier in time, thereby also moving the eye center of the victim data signal earlier in time.

The waveform 308 shows the timing adjusted victim data signal that is generated by the crosstalk compensation circuitry (e.g., crosstalk compensation circuitry 104a) discussed herein. The rising edge of the timing adjusted victim data signal is shifted later in time compared with the waveform 302. Waveform 310 shows the timing adjusted victim data signal that is received at the receiver, with the effect of crosstalk from the attacker data signal. The rising edge of the waveform 310 is centered in the same timing location as the waveform 302, and the eye center of the waveform 310 has the same timing as the eye center of the waveform 302. Accordingly, the timing adjusted victim data signal pre-emptively adjusts the timing of the transition so that the timing adjusted victim data signal arrives at the receiver with proper alignment relative to the clock signal.

FIGS. 2 and 3 may apply to embodiments in which the primary interference between channels is caused by inductive coupling. As discussed above, if the primary interference between channels is caused by capacitive coupling, the crosstalk between channels may have the apposite effect. For example, if the transition of the attacker data signal is in the same direction as the transition in the victim data signal (e.g., both rising edges or both falling edges), the crosstalk between the channels may cause the transition in the victim data signal to be pushed earlier in time. If the transition of the attacker data signal and the transition in the victim data signal are in different directions, then the crosstalk between the channels may cause the transition in the victim data signal to be pushed later time.

Referring again to FIG. 1, in various embodiments, the crosstalk compensation circuit 104a may repeat the edge adjustment process for each UI of the victim data signal and one or more attacker data signals. Accordingly, the value of the control code, and the resulting delay to the victim data signal that is applied by the edge adjustment circuitry 110, may be dynamically adjusted to adapt to the occurrence and direction of the transitions in the victim data signal and one or more attacker data signals.

Figure 4:
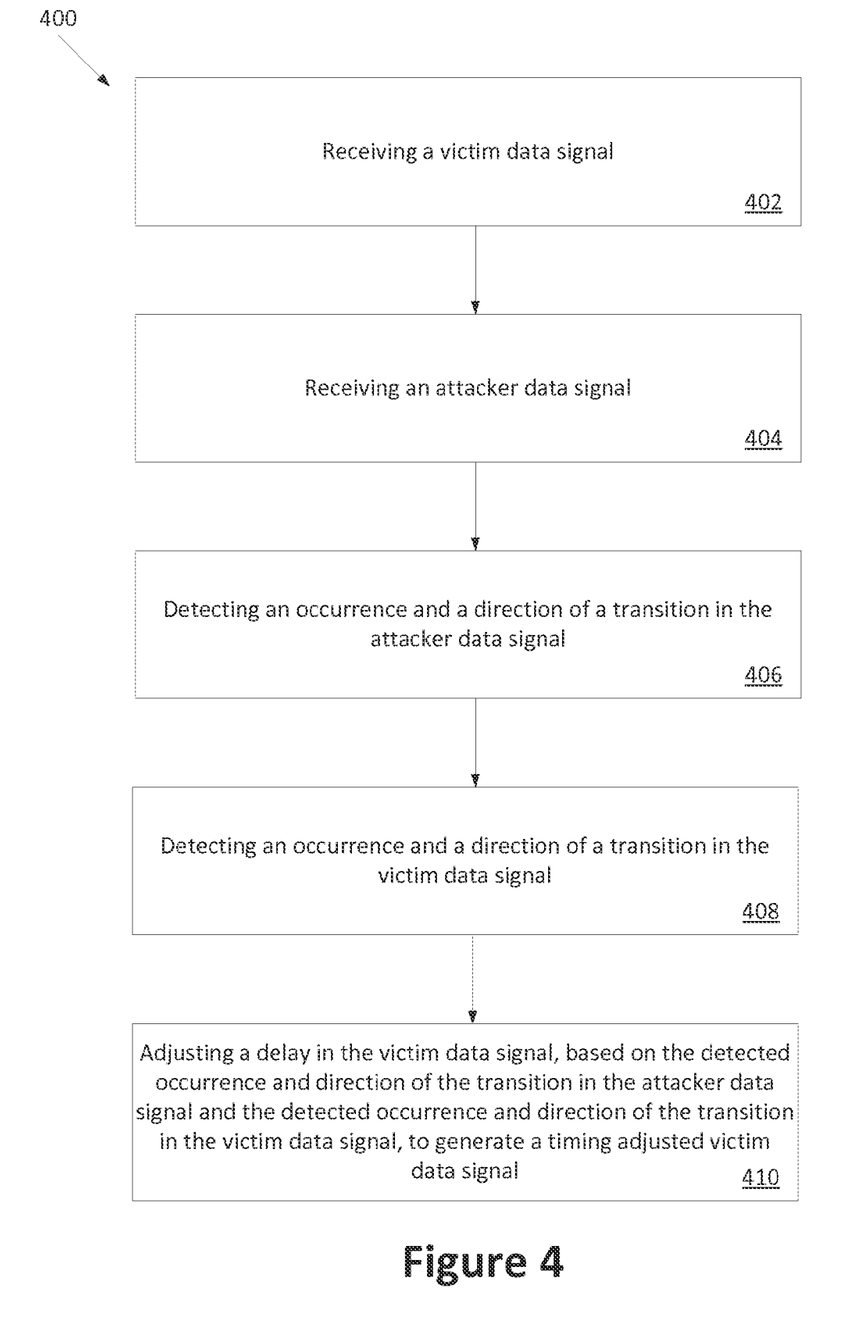
FIG. 4 illustrates a method for crosstalk compensation, in accordance with various embodiments.

FIG. 4 illustrates a method 400 for crosstalk compensation in accordance with various embodiments. The method 400 may be performed, for example, by a crosstalk compensation circuit (e.g., crosstalk compensation circuitry 104a-b). In some embodiments, a computing device may include one or more non-transitory, computer-readable media having instructions, stored thereon, that when executed by one or more processors of the computing device, cause the computing device to perform the method 400.

At 402, the method 400 may include receiving a victim data signal. At 404, the method 400 may include receiving an attacker data signal.

At 406, the method 400 may include detecting an occurrence and a direction (e.g., rising edge or falling edge) of a transition in the attacker data signal. For example, an edge detector (e.g., edge detector 114) of the crosstalk compensation circuit may detect the occurrence and direction of the transition in the attacker data signal.

At 408, the method 400 may include detecting an occurrence and a direction of a transition in the victim data signal (e.g., by the edge detector). The transitions in the victim data signal and attacker data signal may be associated with a same time period (e.g., a UI).

At 410, the method 400 may include adjusting a delay in the victim data signal, based on the detected occurrence and direction of the transition in the attacker data signal and the detected occurrence and direction of the transition in the victim data signal, to generate a timing adjusted victim data signal. For example, the adjusting the delay in the victim data signal may include adjusting the timing of a transition in the victim data signal. In some embodiments, the crosstalk compensation circuit may adjust the timing of the transition in the victim data signal based on the occurrence and direction of the transition in the attacker data signal and a detected occurrence and direction of the transition in the victim data signal. For example, the transition in the victim data signal may be moved earlier in time if the same type of transition (e.g., rising edge or falling edge) is detected in both the victim data signal and the attacker data signal, and the transition in the victim data signal may be moved later in time if a different type of transition is detected in the attacker data signal than the victim data signal.

In various embodiments, the timing adjusted victim data signal may be transmitted to a receiver via a channel. The timing adjusted victim data signal may be affected by crosstalk from the attacker data signal along the channel. The timing adjustment in the timing adjusted victim data signal may compensate for the crosstalk so that the timing adjusted victim data signal arrives at the receiver in proper alignment with the corresponding clock signal.

Figure 5:
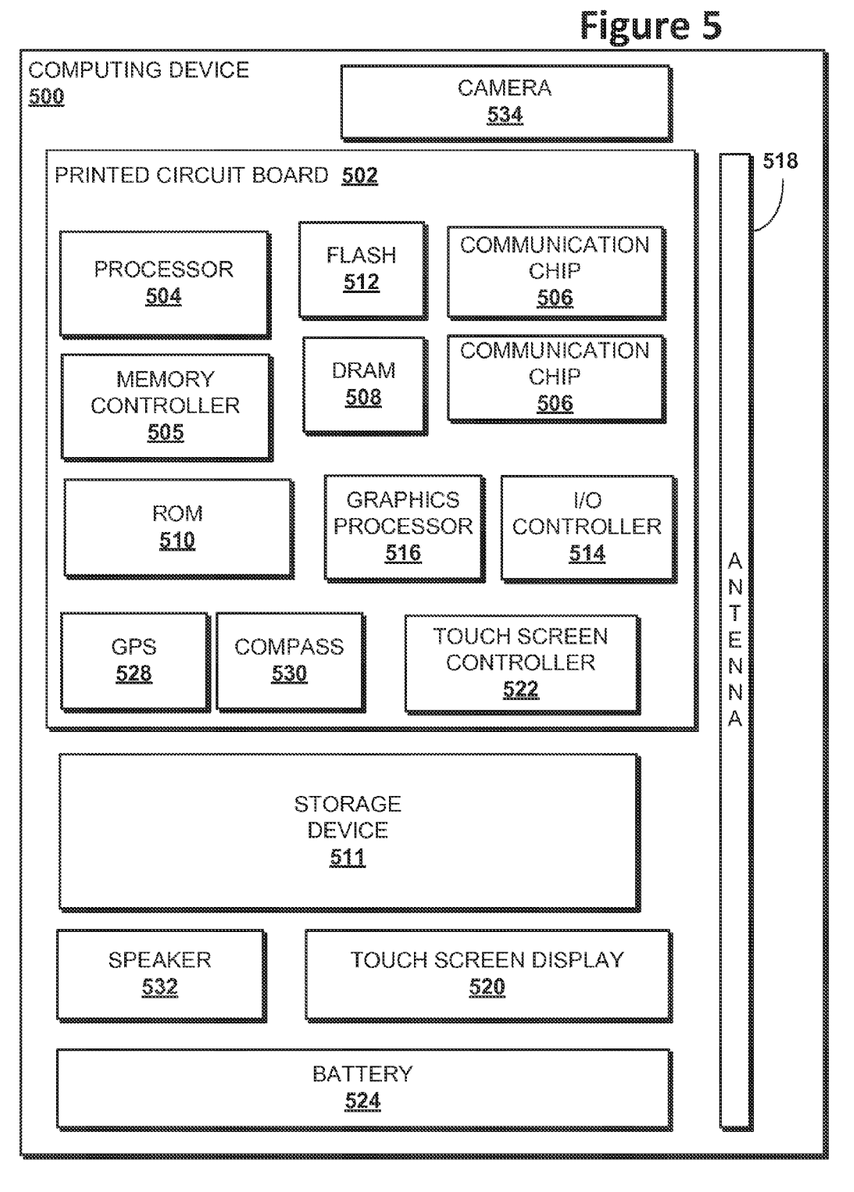
FIG. 5 illustrates an example system configured to employ the apparatuses and methods described herein, in accordance with various embodiments.

FIG. 5 illustrates an example computing device 1100 that may employ the apparatuses and/or methods described herein (e.g., circuit 100, method 400), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller 505, volatile memory (e.g., dynamic random access memory (DRAM) 508), non-volatile memory such as read only memory (ROM) 510, flash memory 512, storage device 511 (e.g., a hard-disk drive (HDD)), I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD)) (not shown), and so forth. In various embodiments, the processor 504 may be integrated on the same die with other components to form a System on Chip (SoC).

In some embodiments, the one or more processor(s) 504, flash memory 512, and/or storage device 511 may include associated firmware (not shown) storing programming instructions configured to enable computing device 500, in response to execution of the programming instructions by one or more processor(s) 504, to practice all or selected aspects of the methods described herein (e.g., method 400).

In various embodiments, these aspects may additionally or alternatively be implemented using hardware separate from the one or more processor(s) 504, flash memory 512, or storage device 511.

In various embodiments, one or more components of the computing device 500 may include the circuit 100 described herein. For example, the circuit 100 may be included in I/O controller 514, processor 504, memory controller 505, and/or another component of computing device 500. The circuit 100 may be used to transmit data signals within a component of the computing device 500 and/or between components of the computing device 500 (e.g., via channels formed on the PCB 502).

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High. Speed. Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Some non-limiting Examples of various embodiments are provided below.

Example 1 is a circuit for crosstalk compensation comprising: edge adjustment circuitry to receive a victim data signal; and control circuitry, coupled to the edge adjustment circuitry, to receive the victim data signal and an attacker data signal, to detect a transition in the victim data signal and a transition in the attacker data signal, and to control the edge adjustment circuitry to adjust a timing attic transition in the victim data signal based on the detected transition in the attacker data signal to generate a timing adjusted victim data signal.

Example 2 is the circuit of Example 1, wherein the control circuitry is to adjust the timing of the transition in the victim data signal based on an occurrence and a direction of the transitions.

Example 3 is the circuit of Example 1, wherein the attacker data signal is a first attacker data signal, wherein the control circuitry is to receive a plurality of attacker data signals including the first attacker data signal, wherein the control circuitry is to detect transitions in the plurality of attacker data signals, and wherein the control circuitry is to control the edge adjustment circuitry to adjust the timing of the transition in the victim data signal based on the detected transitions in the plurality of attacker data signals.

Example 4 is the circuit of Example 3, wherein the plurality of attacker data signals further include a second attacker data signal, wherein the control circuitry is to adjust the timing of the transition in the victim data signal by a first pre-determined amount based on the detection of the transition in the first attacker data signal, and wherein the control circuitry is to adjust the timing of the transition in the victim data signal by a second pre-determined amount based on the detection of the transition in the second attacker data signal.

Example 5 is the circuit of Example 3, wherein the circuit further includes a multiplexer coupled to the control circuitry, the multiplexer to receive a plurality of candidate data signals and to pass a selected subset of the candidate data signals to the control circuitry as the plurality of attacker data signals.

Example 6 is the circuit of any one of Examples 1 to 5, wherein the control circuitry includes: an edge detector to detect the transition in the victim data signal and the transition in the attacker data signal; and logic to determine a value of a control code based on the detected transitions and to output the control code to the edge adjustment circuitry; and wherein the edge adjustment circuitry is to receive the control code and adjust the timing of the transition in the victim data signal based on the value of the control code.

Example 7 is the circuit of: Example 6, wherein the edge adjustment circuitry includes: a first path to receive the victim data signal, the first path including a delay cell to delay the victim data signal and first driving strength adjustable buffer to receive the control code and to increase a driving strength of the delayed victim data signal on the first path as the value of the control code increases; and a second path to receive the victim data signal, the second path including a second driving strength adjustable buffer to receive the control code and to decrease a driving strength of the victim data signal on the second path as the value of the control code increases; wherein the edge adjustment circuitry is to combine output signals of the first and second paths to generate the timing adjusted victim data signal.

Example 8 is the circuit of Example 1, wherein the circuit is included in a transmitter that is to transmit the timing adjusted victim data signal to a receiver circuit via a channel.

Example 9 is the circuit of Example 1 wherein the edge adjustment circuitry and the control circuitry are included in a first crosstalk compensation circuit, wherein the circuit further includes a second crosstalk compensation circuit, wherein the first crosstalk compensation circuit is to receive a first data signal as the victim data signal and a second data signal as the attacker data signal, and wherein the second crosstalk compensation circuit is to receive the second data signal as the victim data signal and the first data signal as the attacker data signal.

Example 10 is a method to be performed by a crosstalk compensation circuit to compensate for crosstalk, the method comprising: receiving a victim data signal; receiving an attacker data signal; detecting an occurrence and a direction of a transition in the attacker data signal; and adjusting a delay in the victim data signal based on the detected occurrence and direction of the transition in the attacker data signal to generate a timing adjusted victim data signal.

Example 11 is the method of Example 10, wherein the attacker data signal is a first attacker data signal, wherein the method includes detecting transitions in a plurality of attacker data signals including the first attacker signal, and wherein the adjusting the delay in the victim data signal includes adjusting the delay in the victim data signal based on the detected transitions in the plurality of attacker data signals.

Example 12 is the method of Example 11, wherein the plurality of attacker data signals further include a second attacker data signal, and wherein the adjusting delay in the victim data signal includes: adjusting the delay in the victim data signal by a first pre-determined amount based on the detection of the transition in the first attacker data signal, and adjusting the delay in the victim data signal by a second pre-determined amount based on the detection of the transition in the second attacker data signal.

Example 13 is the method of any one of Examples 10 to 12, further comprising detecting an occurrence and a direction of a transition in the victim data signal, wherein the adjusting the delay in the victim data signal includes adjusting a timing of the transition in the victim data signal based on the detected occurrence and direction of the transition in the attacker data signal and the detected occurrence and direction of the transition in the victim data signal.

Example 14 is the method of Example 10, further comprising transmitting the timing adjusted victim data signal to a receiver via a channel.

Example 15 is a system with crosstalk compensation comprising: a printed circuit board (PCB); and a first integrated circuit disposed on the PCB. The first integrated circuit includes control circuitry to receive a victim data signal and an attacker data signal, the control circuitry including: an edge detector to detect a transition in the victim data signal and a transition in the attacker data signal; and logic to determine a value of a control code based on the detected transitions and to output the control code. The first integrated circuit further includes edge adjustment circuitry, coupled to the control circuitry, to receive the victim data signal and the control code and to adjust a timing of the transition in the victim data signal, based on the value of the control code, to generate a timing adjusted victim data signal; and an output driver coupled to the edge adjustment circuitry to transmit the timing adjusted victim data signal to a second integrated circuit via a channel on the PCB.

Example 16 is the system of Example 15, wherein the logic is to determine the value of the control code based on an occurrence and a direction of the transitions.

Example 17 is the system of Example 15, wherein the attacker data signal is a first attacker data signal, wherein the control circuitry is to receive a plurality of attacker data signals including the first attacker data signal, wherein the edge detector is to detect transitions in the plurality of attacker data signals, and wherein the logic is to determine the value of the control code based on the transitions in the plurality of attacker data signals.

Example 18 is the system of Example 17, wherein the plurality of attacker data signals further include a second attacker data signal, wherein the control circuitry is to adjust the timing of the transition in the victim data signal by a first pre-determined amount based on the detection of the transition in the first attacker data signal, and wherein the control circuitry is to adjust the timing of the transition in the victim data signal by a second pre-determined amount based on the detection of the transition in the second attacker data signal.

Example 19 is the system of Example 15, wherein the edge adjustment circuitry includes: a first path to receive the victim data signal, the first path including a delay cell to delay the victim data signal and first driving strength adjustable buffer to receive the control code and to increase a driving strength of the delayed victim data signal on the first path as the value of the control code increases; and a second path to receive the victim data signal, the second path including a second driving strength adjustable buffer to receive the control code and to decrease a driving strength of the victim data signal on the second path as the value of the control code increases; wherein the edge adjustment circuitry is to combine output signals of the first and second paths to generate the timing adjusted victim data signal.

Example 20 is the system of Example 15, further comprising a display coupled to the PCB.

Example 21 is the system of any one of Examples 15 to 20, wherein the edge adjustment circuitry is to: adjust the timing of the transition in the victim data signal in a first direction if the transition in the victim data signal and the transition in the attacker data signal are in a same direction; and adjust the timing of the transition in the victim data signal in a second direction, opposite the first direction, if the transition in the victim data signal and the transition in the attacker data signal are in opposite directions.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
   edge adjustment circuitry to receive a victim data signal; and
   control circuitry, coupled to the edge adjustment circuitry, to receive the victim data signal and a plurality of attacker data signals, to detect a transition in the victim data signal and respective transitions in the attacker data signals, and to control the edge adjustment circuitry to adjust a timing of the transition in the victim data signal based on the detected transitions in the attacker data signals to generate a timing adjusted victim data signal.

2. The circuit of claim 1, wherein the control circuitry is to adjust the timing of the transition in the victim data signal based on an occurrence and a direction of the transitions.

3. The circuit of claim 1,
   wherein the plurality of attacker data signals include a first attacker signal and a second attacker data signal,
   wherein the control circuitry is to adjust the timing of the transition in the victim data signal by a first predetermined amount based on the detection of the transition in the first attacker data signal, and wherein the control circuitry is to adjust the timing of the transition in the victim data signal by a second pre-determined amount based on the detection of the transition in the second attacker data signal.

4. The circuit of claim 1, wherein the circuit further includes a multiplexer coupled to the control circuitry, the multiplexer to receive a plurality of candidate data signals and to pass a selected subset of the candidate data signals to the control circuitry as the plurality of attacker data signals.

5. The circuit of claim 1, wherein the control circuitry includes:
an edge detector to detect the transition in the victim data signal and the transitions in the attacker data signals; and
logic to determine a value of a control code based on the detected transitions and to output the control code to the edge adjustment circuitry; and
wherein the edge adjustment circuitry is to receive the control code and adjust the timing of the transition in the victim data signal based on the value of the control code.

6. The circuit of claim 1, wherein the circuit is included in a transmitter that is to transmit the timing adjusted victim data signal to a receiver circuit via a channel.

7. A circuit comprising:
edge adjustment circuitry to receive a victim data signal; and
control circuitry, coupled to the edge adjustment circuitry, to receive the victim data signal and an attacker data signal, to detect a transition in the victim data signal and a transition in the attacker data signal, and to control the edge adjustment circuitry to adjust a timing of the transition in the victim data signal based on the detected transition in the attacker data signal to generate a timing adjusted victim data signal, wherein the control circuitry includes:
an edge detector to detect the transition in the victim data signal and the transition in the attacker data signal; and
logic to determine a value of a control code based on the detected transitions and to output the control code to the edge adjustment circuitry; and
wherein the edge adjustment circuitry is to receive the control code and adjust the timing of the transition in the victim data signal based on the value of the control code;
wherein the edge adjustment circuitry includes:
a first path to receive the victim data signal, the first path including a delay cell to delay the victim data signal and a first driving strength adjustable buffer to receive the control code and to increase a driving strength of the delayed victim data signal on the first path as the value of the control code increases; and
a second path to receive the victim data signal, the second path including a second driving strength adjustable buffer to receive the control code and to decrease a driving strength of the victim data signal on the second path as the value of the control code increases;
wherein the edge adjustment circuitry is to combine output signals of the first and second paths to generate the timing adjusted victim data signal.

8. A circuit comprising:
a first crosstalk compensation circuit including:
edge adjustment circuitry to receive a first data signal as a victim data signal; and
control circuitry, coupled to the edge adjustment circuitry, to receive the victim data signal, to receive a second data signal as an attacker data signal, to detect a transition in the victim data signal and a transition in the attacker data signal, and to control the edge adjustment circuitry to adjust a timing of the transition in the victim data signal based on the detected transition in the attacker data signal to generate a timing adjusted victim data signal; and
a second crosstalk compensation circuit, wherein the second crosstalk compensation circuit is to receive the second data signal as the victim data signal and the first data signal as the attacker data signal.

9. A method to be performed by a crosstalk compensation circuit to compensate for crosstalk, the method comprising:
receiving a victim data signal;
receiving a plurality of attacker data signals;
detecting an occurrence and a direction of respective transitions in the attacker data signals; and
adjusting a delay in the victim data signal based on the detected occurrence and direction of the transitions in the plurality of attacker data signals to generate a timing adjusted victim data signal.

10. The method of claim 9, wherein the plurality of attacker data signals include a first attacker signal and a second attacker data signal, and wherein the adjusting delay in the victim data signal includes:
adjusting the delay in the victim data signal by a first pre-determined amount based on the detection of the transition in the first attacker data signal, and
adjusting the delay in the victim data signal by a second pre-determined amount based on the detection of the transition in the second attacker data signal.

11. The method of claim 9, further comprising detecting an occurrence and a direction of a transition in the victim data signal, wherein the adjusting the delay in the victim data signal includes adjusting a timing of the transition in the victim data signal based on the detected occurrence and direction of the transitions in the attacker data signals and the detected occurrence and direction of the transition in the victim data signal.

12. The method of claim 9, further comprising transmitting the timing adjusted victim data signal to a receiver via a channel.

13. A system comprising:
a printed circuit board (PCB); and
a first integrated circuit disposed on the PCB and including:
control circuitry to receive a victim data signal and an attacker data signal, the control circuitry including:
an edge detector to detect a transition in the victim data signal and a transition in the attacker data signal; and
logic to determine a value of a control code based on the detected transitions and to output the control code; and
edge adjustment circuitry, coupled to the control circuitry, to receive the victim data signal and the control code and to adjust a timing of the transition in the victim data signal, based on the value of the control code, to generate a timing adjusted victim data signal, wherein the edge adjustment circuitry is to:

adjust the timing of the transition in the victim data signal in a first direction if the transition in the victim data signal and the transition in the attacker data signal are in a same direction; and adjust the timing of the transition in the victim data signal in a second direction, opposite the first direction, if the transition in the victim data signal and the transition in the attacker data signal are in opposite directions; and an output driver coupled to the edge adjustment circuitry to transmit the timing adjusted victim data signal to a second integrated circuit via a channel on the PCB.

14. The system of claim 13, wherein the logic is to determine the value of the control code based on an occurrence and a direction of the transitions.

15. The system of claim 13, wherein the attacker data signal is a first attacker data signal, wherein the control circuitry is to receive a plurality of attacker data signals including the first attacker data signal, wherein the edge detector is to detect transitions in the plurality of attacker data signals, and wherein the logic is to determine the value of the control code based on the transitions in the plurality of attacker data signals.

16. The system of claim 15,
wherein the plurality of attacker data signals further include a second attacker data signal, wherein the control circuitry is to adjust the timing of the transition in the victim data signal by a first predetermined amount based on the detection of the transition in the first attacker data signal, and wherein the control circuitry is to adjust the timing of the transition in the victim data signal by a second predetermined amount based on the detection of the transition in the second attacker data signal.

17. The system of claim 13, wherein the edge adjustment circuitry includes:

a first path to receive the victim data signal, the first path including a delay cell to delay the victim data signal and a first driving strength adjustable buffer to receive the control code and to increase a driving strength of the delayed victim data signal on the first path as the value of the control code increases; and a second path to receive the victim data signal, the second path including a second driving strength adjustable buffer to receive the control code and to decrease a driving strength of the victim data signal on the second path as the value of the control code increases;

wherein the edge adjustment circuitry is to combine output signals of the first and second paths to generate the timing adjusted victim data signal.

18. The system of claim 13, further comprising a display coupled to the PCB.

* * * * *